(12) United States Patent
Druz et al.

(10) Patent No.: US 11,466,360 B2
(45) Date of Patent: Oct. 11, 2022

(54) ENHANCED CATHODIC ARC SOURCE FOR ARC PLASMA DEPOSITION

(71) Applicant: Veeco Instruments Inc., Plainview, NY (US)

(72) Inventors: Boris L. Druz, Brooklyn, NY (US); Viktor Kanarov, Bellmore, NY (US); Yuriy N. Yevtukhov, Brooklyn, NY (US); Sandeep Kohli, Syosset, NY (US); Xingjie Fang, Great Neck, NY (US)

(73) Assignee: Veeco Instruments Inc., Plainview, NY (US)

( * ) Notice: Subject to any disclaimer, the term of this patent is extended or adjusted under 35 U.S.C. 154(b) by 6 days.

(21) Appl. No.: 16/997,782

(22) Filed: Aug. 19, 2020

(65) Prior Publication Data

US 2021/0172053 A1 Jun. 10, 2021

Related U.S. Application Data

(62) Division of application No. 15/631,627, filed on Jun. 23, 2017, now abandoned.
(Continued)

(51) Int. Cl.
*C23C 14/06* (2006.01)
*C23C 14/24* (2006.01)
(Continued)

(52) U.S. Cl.
CPC ........ *C23C 14/325* (2013.01); *C23C 14/0605* (2013.01); *C23C 14/0611* (2013.01);
(Continued)

(58) Field of Classification Search
CPC ........... H01J 37/32055; H01J 37/32357; H01J 37/32568; H01J 37/32633;
(Continued)

(56) References Cited

U.S. PATENT DOCUMENTS 3,156,090 A 11/1964 Kaufman
3,913,320 A 10/1975 Reader et al.
(Continued)

FOREIGN PATENT DOCUMENTS

CN 1148824 A 4/1997
CN 1235695 A 11/1999
(Continued)

OTHER PUBLICATIONS

"Inlaid" definition. Google Search of "inlaid", definition by Oxford Languages [https://www.google.com/search?q=inlaid&rlz=1C1GCEB_en&oq=inlaid&aqs=chrome..69i57j0i512l4j0i3j0i512l4.3904j1j1&sourceid=chrome&ie=UTF-8].*
(Continued)

*Primary Examiner* — Michael A Band
(74) *Attorney, Agent, or Firm* — Patterson Thuente Pedersen, P.A.

(57) ABSTRACT

An improved cathodic arc source and method of DLC film deposition with a carbon containing directional-jet plasma flow produced inside of cylindrical graphite cavity with depth of the cavity approximately equal to the cathode diameter. The generated carbon plasma expands through the orifice into ambient vacuum resulting in plasma flow strong self-constriction. The method represents a repetitive process that includes two steps: the described above plasma generation/deposition step that alternates with a recovery step. This step provides periodical removal of excessive amount of carbon accumulated on the cavity wall by motion of the cathode rod inside of the cavity in direction of the orifice. The cathode rod protrudes above the orifice, and moves back to the initial cathode tip position. The said steps periodically can be reproduced until the film with target thickness is deposited. Technical advantages include the film hardness,
(Continued)

density, and transparency improvement, high reproducibility, long duration operation, and particulate reduction.

13 Claims, 9 Drawing Sheets

Related U.S. Application Data

(60) Provisional application No. 62/354,510, filed on Jun. 24, 2016.

(51) Int. Cl.
    | | |
    |---|---|
    | *C23C 14/32* | (2006.01) |
    | *C23C 14/54* | (2006.01) |
    | *C23C 14/56* | (2006.01) |
    | *H01J 37/32* | (2006.01) |

(52) U.S. Cl.
    CPC .......... *C23C 14/542* (2013.01); *C23C 14/543* (2013.01); *C23C 14/564* (2013.01); *H01J 37/32055* (2013.01); *H01J 37/3266* (2013.01); *H01J 37/32357* (2013.01); *H01J 37/32568* (2013.01); *H01J 37/32614* (2013.01); *H01J 37/32623* (2013.01); *H01J 37/32633* (2013.01); *H01J 37/32669* (2013.01); *C23C 14/243* (2013.01)

(58) Field of Classification Search
    CPC ........... H01J 37/32623; H01J 37/32669; H01J 37/3266; H01J 37/32614; C23C 14/0605; C23C 14/543; C23C 14/564; C23C 14/325; C23C 14/0611; C23C 14/243; C23C 14/542
    See application file for complete search history.

(56) References Cited

U.S. PATENT DOCUMENTS

| | | | |
|---|---|---|---|
| 4,565,618 A | 1/1986 | Banks | |
| 4,873,467 A | 10/1989 | Kaufman et al. | |
| 4,929,322 A | 5/1990 | Sue et al. | |
| 5,433,386 A | 7/1995 | Martin et al. | |
| 6,031,239 A | 2/2000 | Shi et al. | |
| 6,042,900 A | 3/2000 | Rakhimov et al. | |
| 6,261,421 B1 | 7/2001 | Meunier et al. | |
| 6,262,539 B1 | 7/2001 | Shi | |
| 6,464,891 B1 | 10/2002 | Druz et al. | |
| 6,465,780 B1 | 10/2002 | Anders et al. | |
| 6,465,793 B1 | 10/2002 | Anders | |
| 6,548,817 B1 | 4/2003 | Anders et al. | |
| 6,548,871 B1 | 4/2003 | Horita et al. | |
| 6,786,035 B2 | 9/2004 | Stickelmaier | |
| 7,557,362 B2 | 7/2009 | Yevtukhov et al. | |
| 9,038,364 B2 | 5/2015 | Stickelmaier et al. | |
| 9,269,545 B2 | 2/2016 | Vetter | |
| 10,014,164 B2 | 7/2018 | Druz et al. | |
| 2004/0075060 A1 | 4/2004 | Luten et al. | |
| 2008/0280135 A1 | 11/2008 | Lee et al. | |
| 2010/0101947 A1 | 4/2010 | Nishimura et al. | |
| 2014/0109549 A1 | 4/2014 | Stickelmaier et al. | |
| 2014/0217022 A1 | 8/2014 | Hashaikeh et al. | |
| 2016/0027608 A1 | 1/2016 | Madocks | |
| 2017/0330738 A1 | 11/2017 | Druz et al. | |
| 2017/0369984 A1 | 12/2017 | Druz et al. | |

FOREIGN PATENT DOCUMENTS

| | | |
|---|---|---|
| CN | 105704903 A | 6/2016 |
| JP | 2011-132078 A | 7/2011 |

OTHER PUBLICATIONS

Boxman et al., "Vacuum Arc Deposition Devices," Rev. Sci. Instrum., 77, Feb. 11, 2001 (2006), 16 pages.

Chapman, "Glow Discharge Processes," J. Wiley & Sons, 1980, p. 10.

Chen, "Introduction to Plasma Physics," Plenum, New York, 1974, Chapt. 2.3.3, 9 pages.

Goodfellow et al., "An Experimental and Theoretical Analysis of the Grid Clearing Capability of the NSTAR Ion Propulsion System," Jet Propulsion Laboratory, Jun. 1999, 11 pages.

Krinberg et al., "Pinch Effect in Vacuum Arc Plasma Sources Under Moderate Discharge Currents," J. Phys. D.: Appl, Phys. 35(2002) 549-562.

Lieberman et al., "Principals of Plasma Discharges and Materials Processing," John Wiley & Sons, 1993, p. 458 & p. 450.

Loeb et al., "Feasibility Study of Large-Scale Rf-Ion Thrusters," University Giessen, 1988, 13 pages.

Scheibe et al., "Deposition of Superhard Morphous Carbon Films by Pulsed Arc Sources," XVIIth International Symposium on Discharges and Electrical Insulations in Vacuum, Berkley, 1996, p. 941-945.

Chinese Patent Application No. 201710495599.4, Office Action dated Jun. 24, 2019, 16 pages.

PCT Application No. PCT/US2017/030970, Search Report & Written Opinion dated Aug. 9, 2017, 11 pages.

Singapore Application No. 10201705059T, Search Report dated Feb. 27, 2018, 3 pages.

Taiwan Application No. 106120988, Search Report dated Jan. 24, 2021, 1 page.

Application and File history for U.S. Appl. No. 15/631,627, filed Jun. 23, 2017, Inventors: Druz et al.

Application and File History of U.S. Appl. No. 15/592,426, filed May 11, 2017, Inventors Druz et al.

\* cited by examiner

ENHANCED CATHODIC ARC SOURCE FOR ARC PLASMA DEPOSITION

RELATED APPLICATION

This application is a continuation of U.S. application Ser. No. 15/631,627 filed Jun. 23, 2017, which claims the benefit of U.S. Provisional Application No. 62/354,510 filed Jun. 24, 2016, each of which is hereby fully incorporated herein by reference.

FIELD OF THE DISCLOSURE

The disclosure relates generally to deposition technology of thin films using cathodic arc plasma sources, and more particularly to technology adapted for repeatable deposition of super hard and/or super dense, low defect carbon films.

BACKGROUND OF THE DISCLOSURE

Improving of wear and corrosion resistance and glide behavior is an important consideration in the fields of thin film technology. These applications represent a variety of hard service conditions which often are present simultaneously, such as adhesive, abrasive, and corrosive interaction with the gliding counterpart and the surrounding medium. Diamond-like carbon ("DLC") coatings seem to fulfill many of these demands for a protective layer: DLC represents the material with high mechanical stiffness characterized by high hardness and Young Modulus. Furthermore it shows only weak adhesion affinity to metals and most other materials. It is inert to most aggressive agents and environment.

The deposition of DLC coatings using cathodic arc plasma is a coating technology with great potential. Cathodic arc plasmas are highly ionized and therefore can be manipulated with electric and magnetic fields. More often electrical field is used to change the ion energy and thus the structure and properties of deposited films; magnetic field is used to guide and homogenize the plasma.

Cathodic arc current is typically localized in minute non-stationary cathode spots. Spot formation provides sufficient power density for plasma formation, electron emission, and current transport between the cathode and anode. Macro-particles originate from plasma—solid interaction at cathode spots.

Many approaches were proposed and tested to eliminate macro-particles from cathodic arc plasmas, such as the curved magnetic filters. Although metal, metal-compound, and DLC films have been synthesized, macro-particles filters suffers from two major drawbacks: (1) the plasma transport is inefficient, i.e. only a fraction of original plasma is actually usable for film deposition, and (2) the removal of macro-particles is not complete.

The design of macro-particles filters depends on the mode of arc operation. DC arc plasma sources are usually equipped with cathode of large size, e.g. diameter of 1-2". The spot location may be magnetically controlled. In any case, the location(s) of plasma production the micron size cathode spot(s), can vary across the cathode surface, and cross-section of the filter entrance must be large enough to accommodate the various spot(s) locations. A large filter entrance implies a large filter in length, volume, and weight. Virtually all of the DC operated filters have a "closed" architecture in the sense that the filter volume is enclosed in a tube or duct which is surrounded by magnetic field coils. Ideally, macro-particles cannot leave the filter volume. The particles are expected to stick to the duct wall or to be caught between baffles that are placed inside of the duct. One approach would be a filtered cathodic arc source with a filter of closed architecture having a toroidal duct with 2 bends. The duct is typically relatively large, with a diameter 4-6".

However, catching macro-particles is difficult for some cathode materials such as carbon because the macro-particles tend to elastically reflect from surfaces. This "bouncing" problem can be addressed by filters with open architecture where "bouncing" is used to let macro-particles escape from the region of plasma transport. Filters of open architecture do not have a duct but instead include of a few turns of a magnetic filter coil. The coil must have a relatively high current to generate sufficient magnetic field strength despite the small number of turns per length. An open architecture filter in combination with a compact arc source with a cathode of small area and operated in pulsed mode is desirable to have clean carbon plasma delivered to a deposition target. Limitations of this technology include the fact that the plasma flow expansion takes place approximately within a cone with a half-angle $\sim\pi/3$ when the flow cross-section increases as $S(r)\sim r^2$. The flow expansion typically results in plasma cooling effect, ions deceleration and, in consequence, in reduction of sp3/sp2 ratio (and reduced hardness, density, transparency); and "parasitic" carbon deposits on the anode surfaces that leads to degradation of carbon film deposition rate on the target.

Some new micro-electro-mechanical systems ("MEMS") applications and particularly magnetic heads with heat assisted magnetic recording may require thin carbon films with extreme high hardness, density, and transparency, as well as enhanced thickness reproducibility.

SUMMARY OF THE DISCLOSURE

Various embodiments of the disclosure provide an improved method of carbon film deposition and an improved cathodic arc plasma source with goals to accomplish extreme hardness, density, and transparency of the deposited films; reduced amount of particles generated in the system and delivered to the film surface. Certain embodiments further enhance deposition rate control and reduced degradation of the deposited film thickness over life of the cathode. Various embodiments can further sustain the high source efficiency by reducing the carbon "parasitic" deposition on the anode and filter coil surfaces.

In the present invention, we disclose a cathodic arc source having a cylindrical graphite cathode rod and an anode that is separated by shield; said shield includes an insulator tube with a thin wall graphite bushing inside of the tube, and the shield can be extended from the cathode top surface, forming a graphite cavity—semi-confined space with orifice shape identical to the cathode top surface. In one embodiment, the depth of the cavity is approximately equal to the cathode diameter. Carbon plasma that is generated in the cavity expands through the orifice into ambient vacuum. We have found that several factors, including the cavity geometry, limit the plasma flux angular distribution that results in plasma flow stronger constriction and, in turn, stronger magnetic self-pinching effect. The result of the plasma generation in the cavity are directional plasma flow within very narrow cone angle; plasma heating leading to intensive interaction of plasma and droplets that contributes to higher plasma density raise as well as evaporation of graphite droplets/particles; and ion acceleration.

Periodically the cavity wall can be cleaned using a repetitive process that includes two steps: plasma generation/deposition step described above that alternates with recovery step. During the recovery step the graphite rod is moved along the axis protruding above the orifice, and returned back to the initial cathode tip position. This periodic cleaning operation removes of evaporated graphite excess accumulated on the wall of the cavity. A reproducible process can be sustained for a long time without breaking the chamber vacuum.

A different mode of magnetic filter operation can be used as a result of directional plasma flow expanding from the source. As it was mentioned constriction of the plasma leads to directional or a macro jet like shape of the plasma flow so that most of the plasma is injected into the filter duct entry. It is not necessary to have strong magnetic lens at the filter entry that collects diverged plasma flux typical for prior art source. This allows the filter to be operated by using substantially decreased current through the filter coil (approximately 700 A in one embodiment vs. 1600 A in the prior art). The reduced magnetic field inside of the coil still strong enough to "magnetize" electrons and transmit plasma trough solenoidal filter, but at the same time prevents partial reflection of the plasma due to magnetic mirror effect (F. F Chen. Introduction to plasma physics (Plenum, New York, 1974. Chap. 2.3.3). The plasma loss is substantially reduced at the filter duct enter, while efficiency of transport through the filter remains the same. So, overall it results in film deposition rate increase on the wafer.

Other features and advantages are described and more readily apparent from a review of the detailed description which follow.

DETAILED DESCRIPTION

Figure 1:
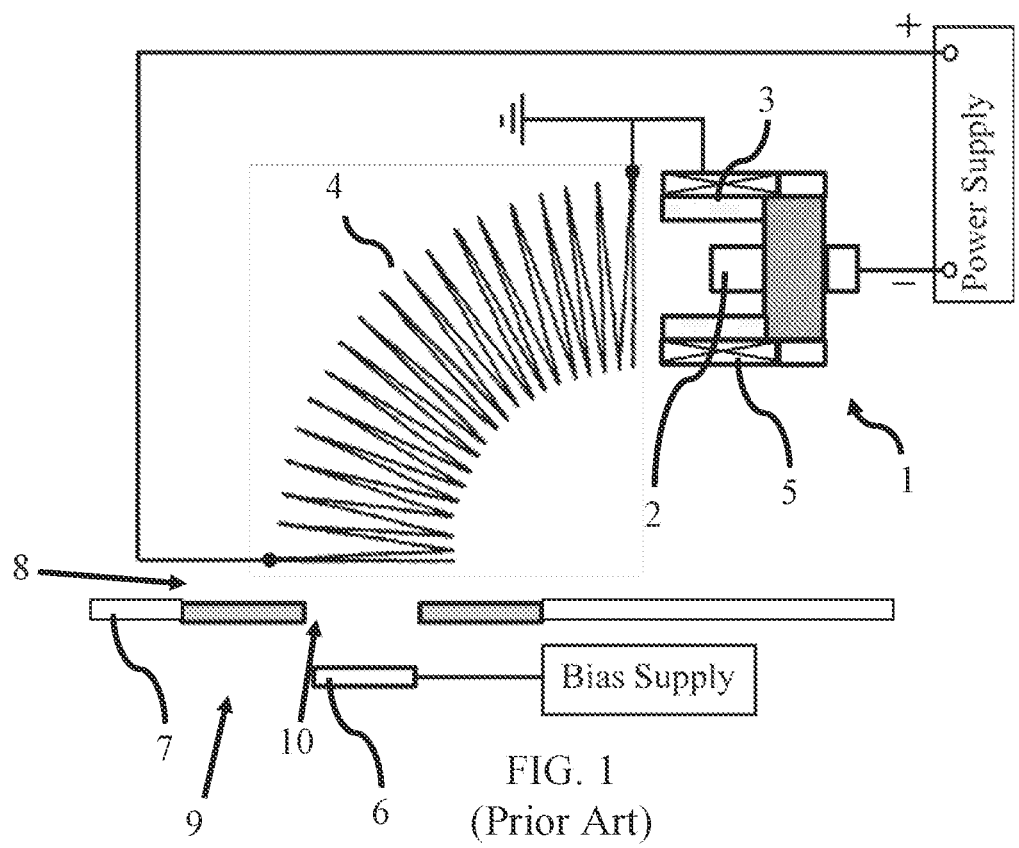
FIG. 1 is a schematic view of the prior art miniaturized source; electrical connection of cathode-anode unit, and magnetic filter to a cathodic arc power supply.

FIG. 1 is a schematic diagram illustrating a miniaturized Pulsed Filter Cathodic Arc (PFCA) source with open architecture filter. As shown in FIG. 1, a miniaturized cathodic arc source 1 has a cathode 2 inside of anode 3. The cathodic arc source 1 can be located close to the entrance to filter 4, e.g. the surface of the cathode 2 is preferably located at a distance of about 0.5-2 times the inner diameter of the filter coil from the entrance. Cathodic arc source 1 may also include a focusing or injection solenoid 5 to increase the plasma output from the source into the filter. The filter can be formed from of a bent solenoidal coil with an open architecture, often with at least one of the following features: 1) additional field injection or focusing coils at the filter entrance to improve the plasma output from the source into the filter, and 2) coil turns having a flat cross-sections to promote macro-particles reflection out of the filter volume. The plasma from the filter is expended in direction of a substrate 6 where the film deposition occurs. An additional feature shown in the FIG. 1 is that the source 1 and filter 4 can be separated from the substrate 6 by particles blocking wall 7. Wall 7 functions as a macro-particle firewall which separates the macro-particle contaminated source and filter chamber 8 from a clean plasma process chamber 9. An opening 10 in wall 7 through which the filtered plasma can enter chamber 9 can be kept small. Ideally the wall 7 is very close to the end of the filter 4 so all the plasma passes through opening 10.

Figure 2:
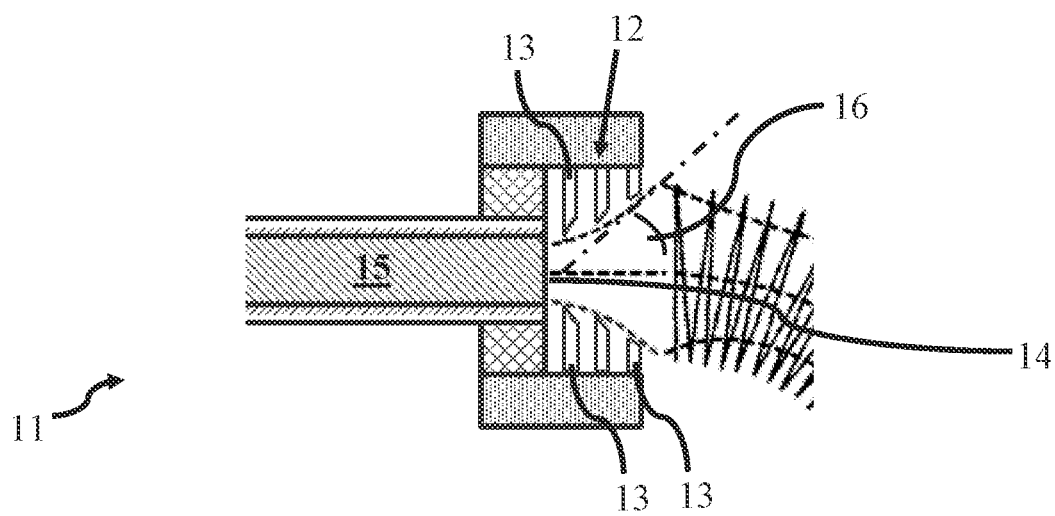
FIG. 2 is a cross-section of the prior art miniaturized source with anode formed of a plurality of spaced baffles and open architecture filter.

As shown in FIG. 2, cathodic arc plasma source 11 can have an anode 12 formed of a plurality of spaced baffles 13 which extend beyond the active cathode surface 14 of cathode 15. In other prior art sources where the anode is a cylindrical housing the cathode assembly, most macro-particles generated at the cathode are ejected at shallow angles with respect to the cathode surface, and either stick to the anode or are reflected back into the plasma. With the open baffle structure of anode 12 of source 11, most macro-particles pass through the gaps between baffles 13 and reflect off baffles 13 out of the plasma stream that enters the filter. Such an anode not only has an electrical function but serves as a pre-filter.

Source 11 is operated in pulsed mode at relatively high currents, about 1 kA or higher. The high arc current is typically used to operate the magnetic filter. Power consumption and associated heat load can thus be regulated via the arc pulse duty cycle and pulse length rather than arc current which would lower the filter field.

The cathode surface during operation is represented in prior art embodiments as ideally flush with respect to the end surface of the insulator ceramic around the graphite cathode. Erosion of the cathode surface is ideally counteracted by gradual advancement of the cathode. The gradual advancement can be performed by special feed mechanism coupled to cathode rod 15. In one embodiment, the feed mechanism (manual or motorized) advances the cathode at such speed that sustains the cathode position by compensating graphite erosion.

A consideration in determining the source performance is the plasma flow angular distribution. Even every arc spot on the cathode surface generates micro jets of plasma perpendicular to the cathode surface; overall plasma flow has conical or rather semispherical shape. (See FIG. 2, having cone angle 16). Probably, this is a result of integration of micro jets into divergent plasma flow caused by time averaging of instant distribution of micro jets, as well as rough cathode surface topology. Divergence of the plasma flow can result in substantial plasma losses due to difficulty to collect the generated plasma into the filter. Further, divergence of the plasma flow can result in excessive deposition of carbon on the anode and filter surfaces leading to degradation of the plasma flow intensity and shape (in turn deposition rate, and uniformity of the film deposited on a substrate). Divergence of the plasma flow can also result in deterioration of the films properties due to the generated ions average moment reduction, and as a result of this decrease of ions energy arriving on the substrate.

Figure 3A:
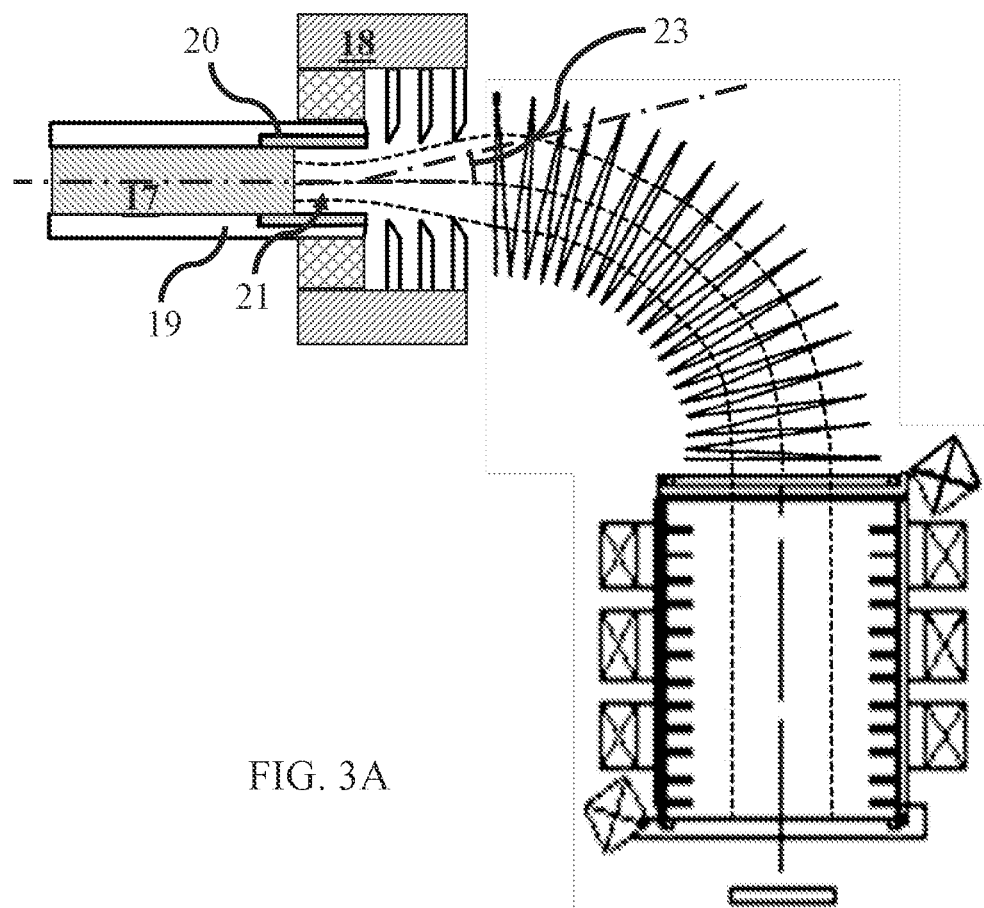
FIG. 3A is a schematic view of a source in a disclosed embodiment.

An improved cathodic arc source and method of this source operation is disclosed. A schematic of a disclosed embodiment is shown in FIG. 3A. Certain embodiments include cathode 17 separated from anode 18 by shield 19, which includes insulator tube with thin wall graphite bushing 20 inside of the tube, and the shield is extended from the cathode top surface forming a cavity 21, or semi confined space with outlet orifice shape similar to an exposed top surface of cathode 17, and a depth of cavity 21 approximately equal to a diameter of cathode 17.

Graphite bushing 20 represents a graphitic thin wall cylindrical insert, or graphite coating inside of the ceramic tube formed by carbon solution with carbon based binder with subsequent annealing.

Figure 3B:
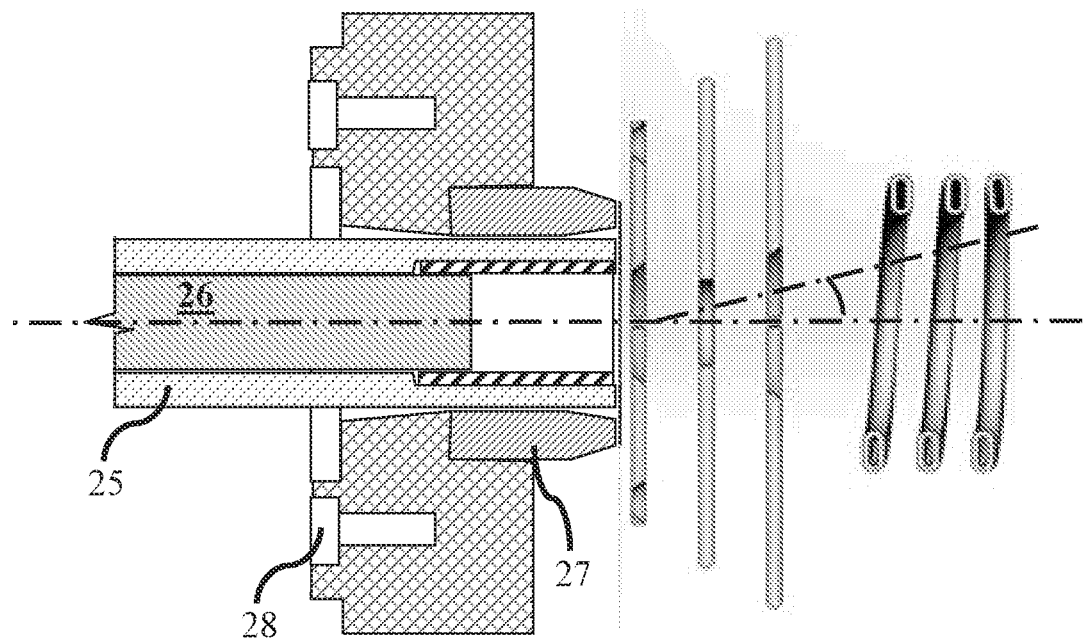
FIG. 3B is a cross-section of the spatial distribution of the arc plasma flow within cathode-anode area with reference of cone angle of plasma flow to the prior art.

Carbon plasma that is generated in the cavity expands through the orifice into ambient vacuum. We have found that several factors including the cavity geometry limit the plasma flux angular distribution 23. FIG. 3B depicts an enlarged view of cathode anode assembly. Confinement of arc discharge in the cavity results in higher heat load. Improvements to enhance cathode unit thermal capacity were made: changing alumina ceramic to beryllium oxide (BeO) ceramic 25 enhanced thermal conductivity 10×; changing cathode 26 diameter from 6$mm$ to 10 mm, resulting in ~65% thermal conduction area increase; new anode collet design 27 to reduce interface thermal resistance. Cathode body 28 with coolant flow provides continuous heat removal.

Figure 4A:
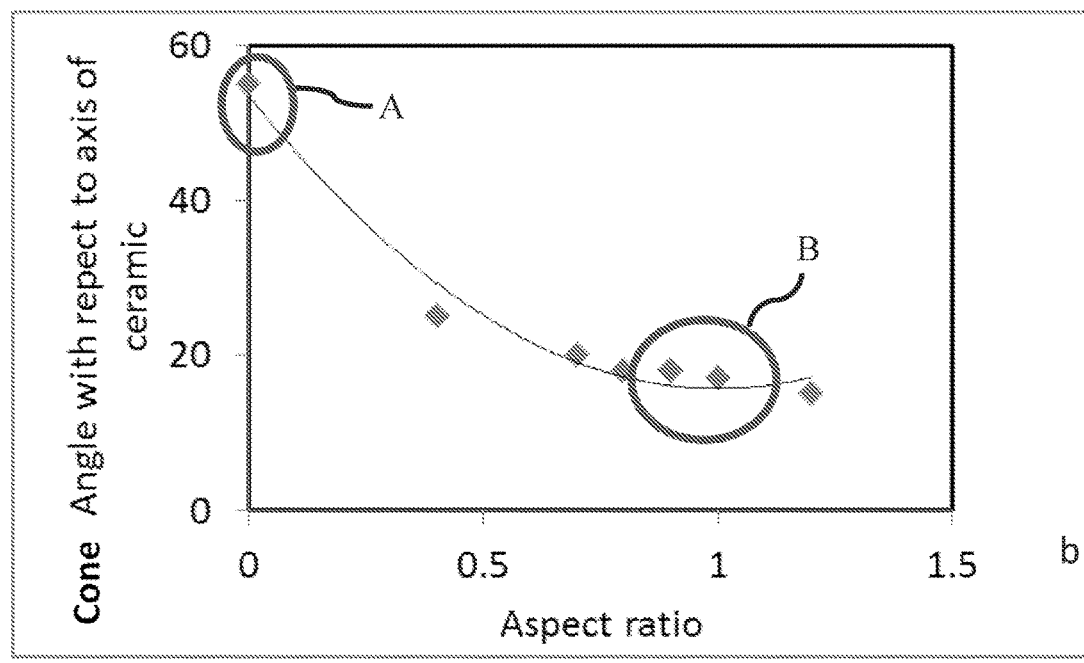
FIG. 4A shows a comparison of plasma flux distribution of cone angle of plasma flow distribution vs. cavity aspect ratio in side view.
Figure 4B:
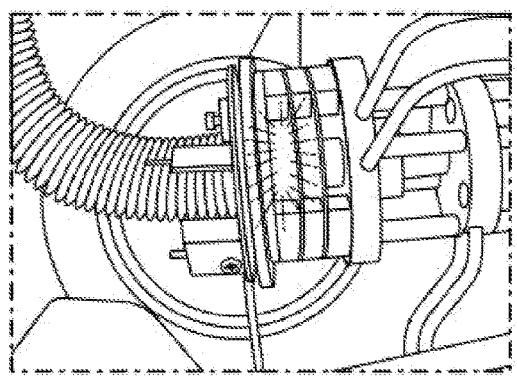
FIG. 4B shows a prior art plasma source.
Figure 4C:
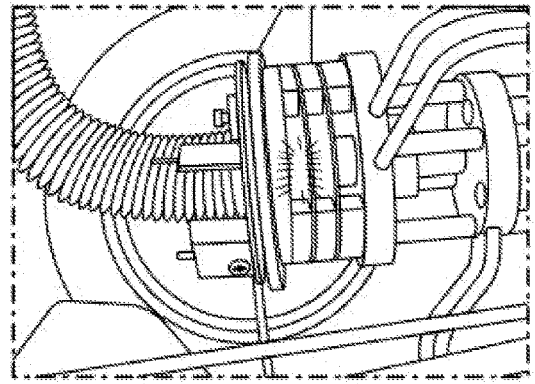
FIG. 4C shows a plasma source according to an embodiment.

The plasma flow cone angle is shown in FIG. 4. Conventional systems show an aspect ratio of approximately 0 and a cone angle of about 50-60° (as indicated in the encircled "A" data point, FIG. 4A), while systems as described and claimed herein exhibit a higher aspect ratio of between about 0.5 and 1, with a narrower cone angle of between about 15° and about 30°, in embodiments (as indicated in the encircled "B" data point, FIG. 4A). Optical images of the plasma flow distribution generated by the prior art source (FIG. 4B) and the presently disclosed source (FIG. 4C) are compared in FIG. 4. It is evident from the results that strong constriction of the plasma is observed when plasma was generated in the cavity by the source of the embodiment photographed in FIG. 4B.

Figure 5A:
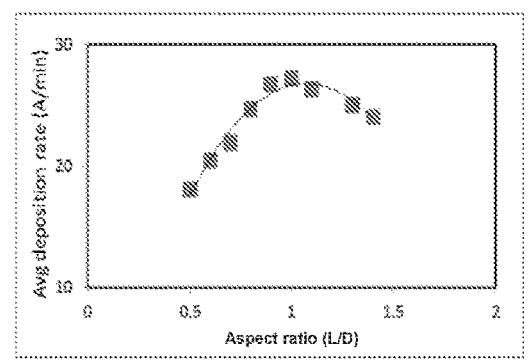
FIG. 5A shows dependency of deposition rate at the wafer on aspect ratio.
Figure 5B:
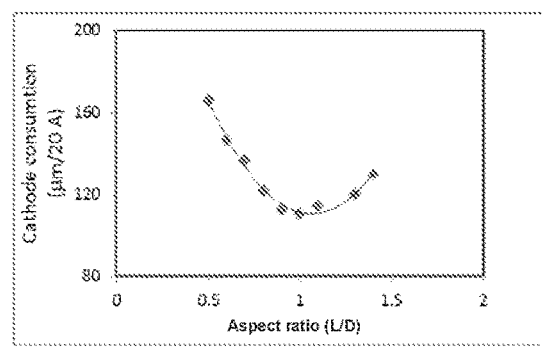
FIG. 5B shows dependency of graphite rod consumption (per 20 A thick film) on aspect ratio.
Figure 5C:
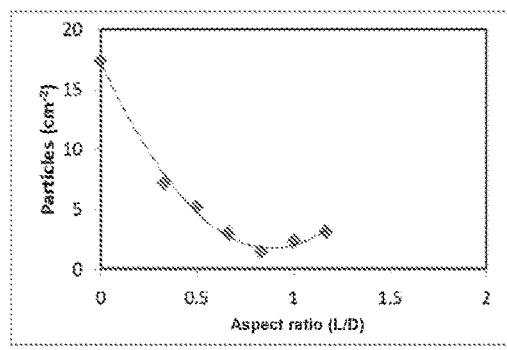
FIG. 5C shows dependency of particle size on aspect ratio of depth to diameter.

Performance improvement of the deposition source resulting from strong constriction of the plasma flow is shown in FIGS. 5A-5C. In certain embodiments, the plasma flow strong constriction occurs when the cavity aspect ratio (depth/diameter) is about 1. The following performance improvements over prior art sources were observed: (a) deposition rate more than 2 times increased; (b) particles densities about 15 times reduced; and (c) cathode consumption was reduced about 2 times. If the cavity aspect ratio is higher than approximately 1.2 the plasma can become unstable. Therefore, based on cathode consumption, deposition rate, and particle densities as shown in FIGS. 5A, 5B, and 5C, an ideal aspect ratio is about 1.

Figure 6:
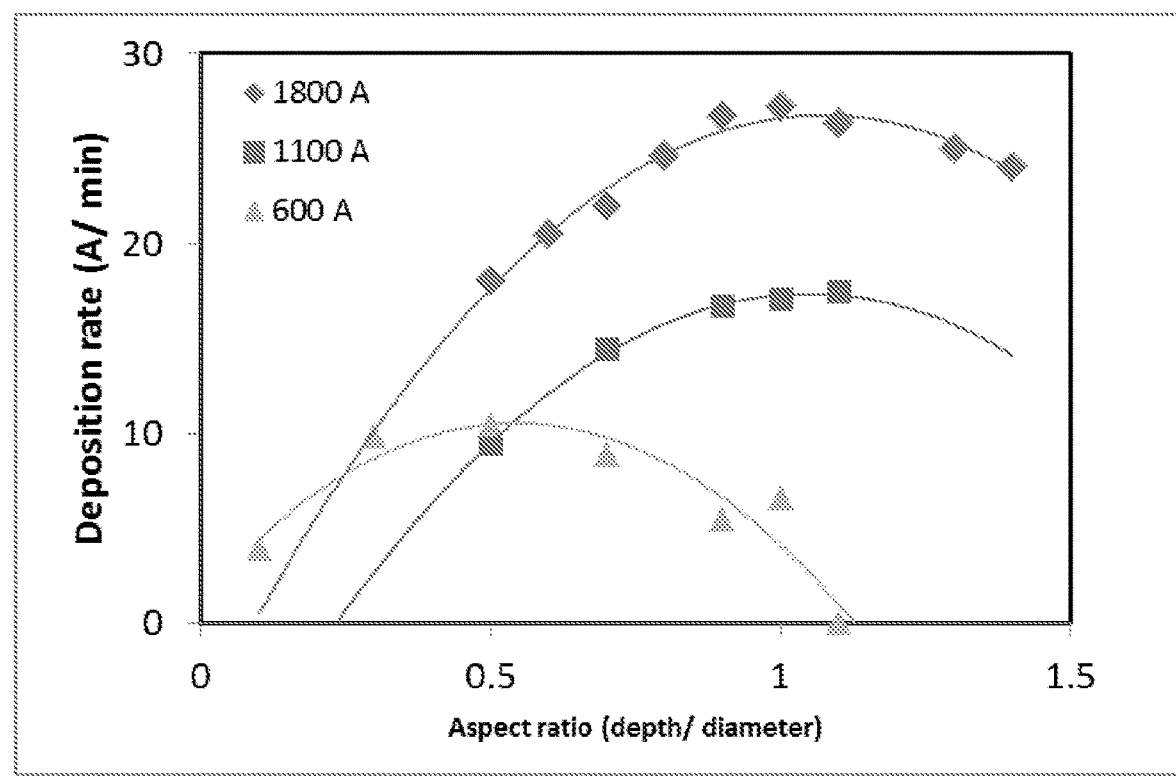
FIG. 6 shows dependencies of deposition rate vs. aspect ratio of depth to diameter for different arc discharge current. Reduction of arc discharge current below 600 A value results in diminished magnetic self-pinching effect and deposition rate substantial reduction.
Figure 7A:
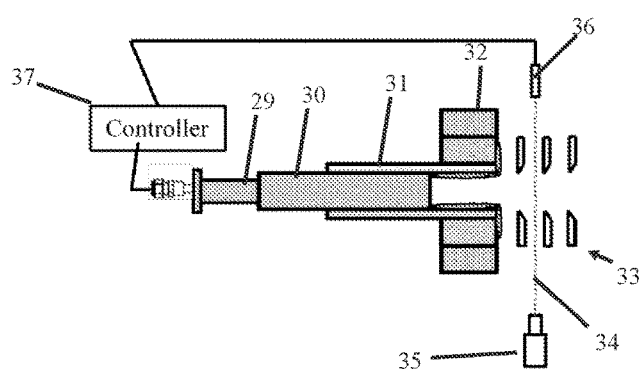
FIGS. 7A-7D are schematics of a device that provides motion and position control of the graphite cathode during recovery stage—cleaning the cavity from excess of the accumulated carbon: motion is provided by linear motor with controller, and laser provides the cathode rod position feedback to the controller.
Figure 7B:
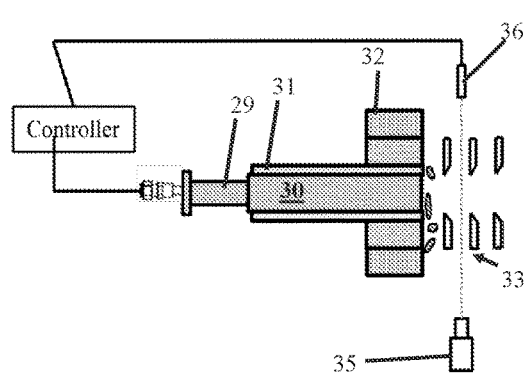
Figure 7C:
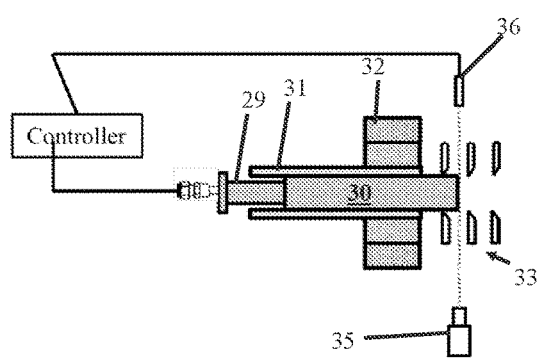
Figure 7D:
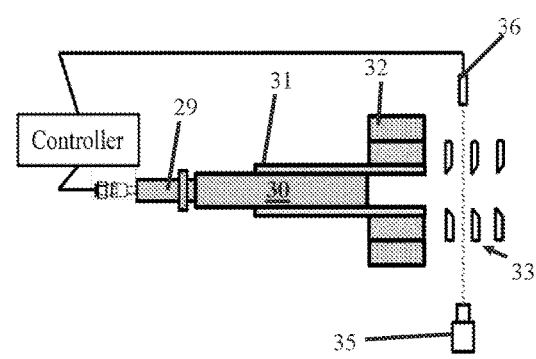

Another parameter that affects the plasma flow constriction is discharge current. In FIG. 6 an example of dependence of deposition rate vs. the cavity aspect ratio for variable discharge current is presented in an embodiment of the disclosure. It is clear from the graph that the strong effect is observed at discharge current higher than about 600 A. At discharge currents 600 A and below the effect of plasma flow constriction and process performance improvement is reduced.

FIGS. 7A-7D depict a system for producing a carbon containing directional jet plasma flow with a cylindrical cathodic arc source. In one embodiment, a repetitive process is disclosed comprising two steps: the above-described plasma generation/deposition step that alternates with a recovery step. The recovery step provides periodical removal of excessive amount of carbon accumulated on the cavity wall. The recovery step is shown in FIGS. 7A-7D. In the depicted embodiment, the source includes motion mechanism 29 of cathode 30 automatically controlled by a controller. Cathode 30 can be moved forth and back inside of shield 31 (e.g, in FIG. 7A cathode 30 is retracted within shield 31, in FIG. 7B cathode 30 is flush with shield 31). Cathode 30 can also be advanced outside of the shield 31 into the anode baffle area defined by baffles 33. A position of the cathode tip can be determined by detection of a beam 34 produced by laser 35. Laser detector 36 communicates with the controller 37 providing feedback for return of cathode 30 to the initial location. The recovery procedure can include four sub-steps: Sub-step 1: Initial Cathode position after deposition; Sub-step 2: Cathode motion—cleaning of C excess; Sub-step 3: Cathode position calibration; Sub-step 4: Return to the initial position. During these sub-steps the graphite rod is moved along the axis protruding above the orifice, and returned back to the initial position. This motion provides removal of evaporated graphite excess accumulated on the wall of the cavity while the graphite bushing surface still remains intact sustaining arc during the next run. A reproducible process can be sustained for a long time relative to conventional systems without breaking the chamber vacuum.

Figure 8:
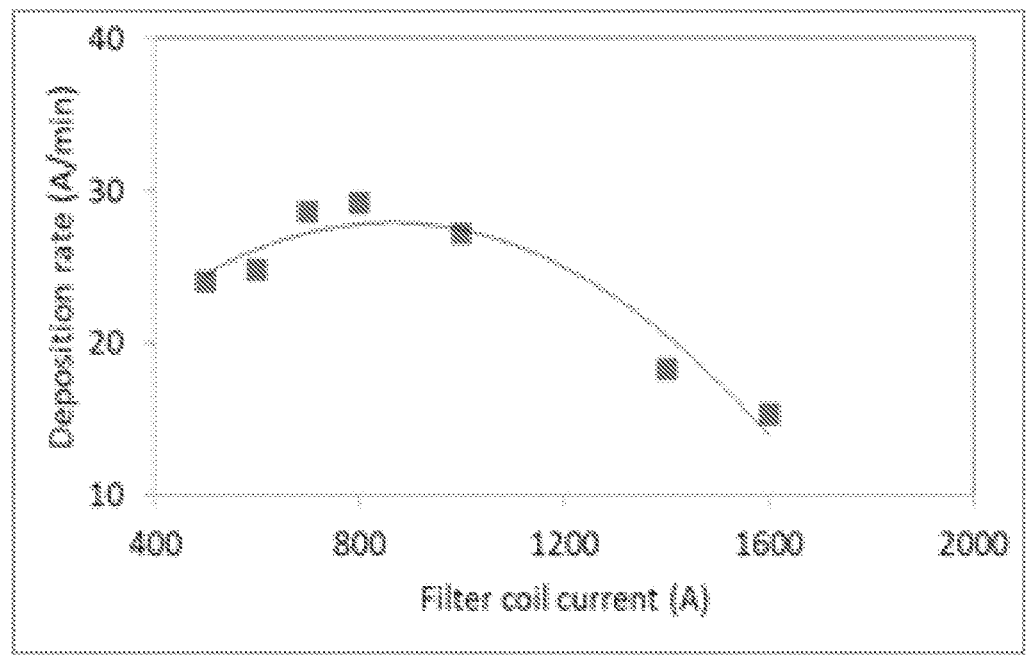
FIG. 8 shows dependence of deposition rate vs. filter coil current in an embodiment of the disclosure with the source operating in hybrid mode—power to the filter is applied before arc discharge starts and completed after arc discharge ends.

The magnetic filter can be operated at different, more optimal mode of operation as a result of "directional" plasma flow expanding from the cavity when compared to conventional systems. As mentioned previously, constriction of the plasma flow leading to directional or a macro jet like shape of the plasma so that most of the plasma is injected into the filter duct entry without need for a strong magnetic lens (by running a 1300-1500 A current in the filter solenoid, or using additional focusing solenoid 5) at the filter entry that collects diverged plasma flux typical for prior art source, such as the one shown with respect to FIG. 1. This allows the filter to operate by using a substantially decreased current through the filter coil (approximately 700 A in one disclosed embodiment vs. 1600 A in the prior art), as shown in FIG. 8. The reduced magnetic field inside of the coil is still strong enough to "magnetize" electrons and transmit plasma through the solenoidal filter, but at the same time prevents partial reflection of the plasma due to magnetic mirror effect. The plasma loss is substantially reduced at the entrance of the filter duct, while efficiency of transport through the filter remains the same. So, overall embodiments described herein are configured for film deposition rates that build up a wafer at a rate of about 2 times that of a conventional system.

Figure 9:
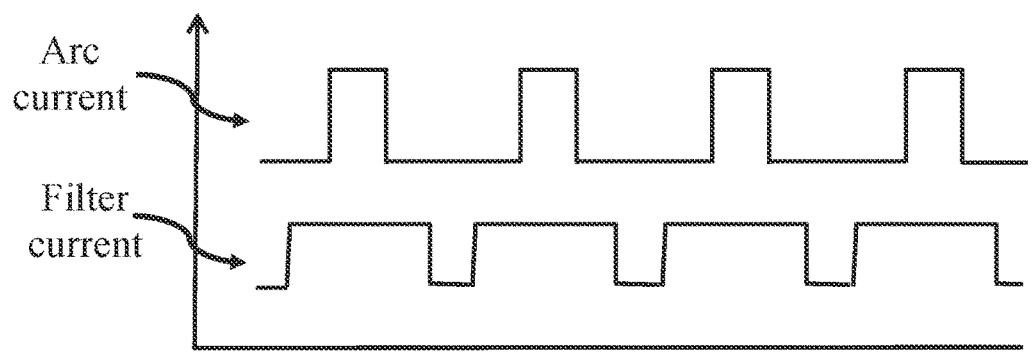
FIG. 9 is a chart depicting an operating pattern for arc current and filter current according to an embodiment.

In various embodiments, another improvement is related to utilization of hybrid mode of the source and filter operation shown in FIG. 9. The filter can be turned on before arc discharge starts and turned-off after discharge arc is ended (in prior art arc and filter pulses are typically synchronized). This mode of operation allows for reduced arc disturbance by filter coil current transitions at start/end of filter pulse; and better controls the filter coil thermal conditions.

In one example of carbon film deposition, the source parameters could be the following: cavity aspect ratio (depth/diameter)=1; cathode diameter=10 mm; double-bent filter; arc discharge current=1800 A; filter current=700 A; length of arc pulse=1 msec; length of filter coil=25 msec; frequency of pulses=5 Hz; and deposition/recovery steps repeating after every 1000 pulses.

TABLE

Data Summary

| Technology Parameters | Disclosure | Prior Art |
|---|---|---|
| Hardness, GPa, 500 A thick film | 92* | 80* |
| Density, g/cm$^3$, 200 A thick film | 3.3 | 3.1 |
| Stress, GPa, 200 A thick film | 7.5-8.5 | 5-6 |
| Absorption at λ = 800 nm, 100 ($I - I_0/I_0$) %, 20 A thick film | $5 * 10^{-2}$ | $16 * 10^{-2}$ |
| Relative transport efficiency | ~5 | ~1 |
| Particles per cm$^2$, 20 A thick film | ~1-2 | ~20-25 |

*Measurements were performed by Hysitron

The data obtained by the above described embodiment source and prior art source are compared. It is seen from the table that mechanical and optical properties are noticeably improved; particle amounts on the surface of the deposited films are reduced; and losses of the plasma substantially decreased that resulted in plasma transport efficiency raise.

In another example illustrating the deposition rate reproducibility, an operation can be configured to illustrate long time source operation over the cathode life. In particular, the conditions of operation are as follows: the source parameters are the same as in the previous example; deposition rate is measured after every 10,000-15,000 pulses; and total amount of pulses performed during test was 150,000 pulses.

Figure 10A:
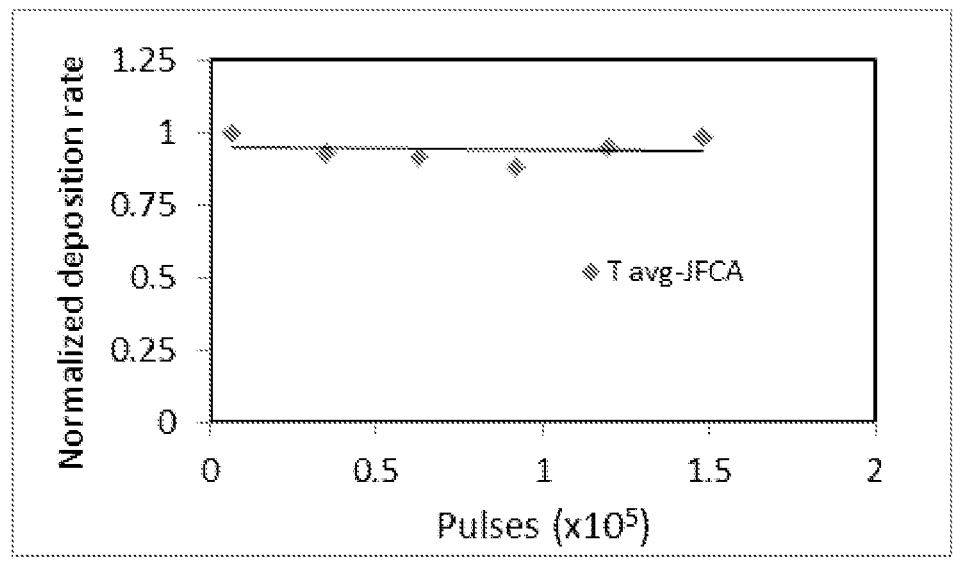
FIGS. 10A and 10B are charts of normalized deposition rate vs. pulses, according to an embodiment.
Figure 10B:
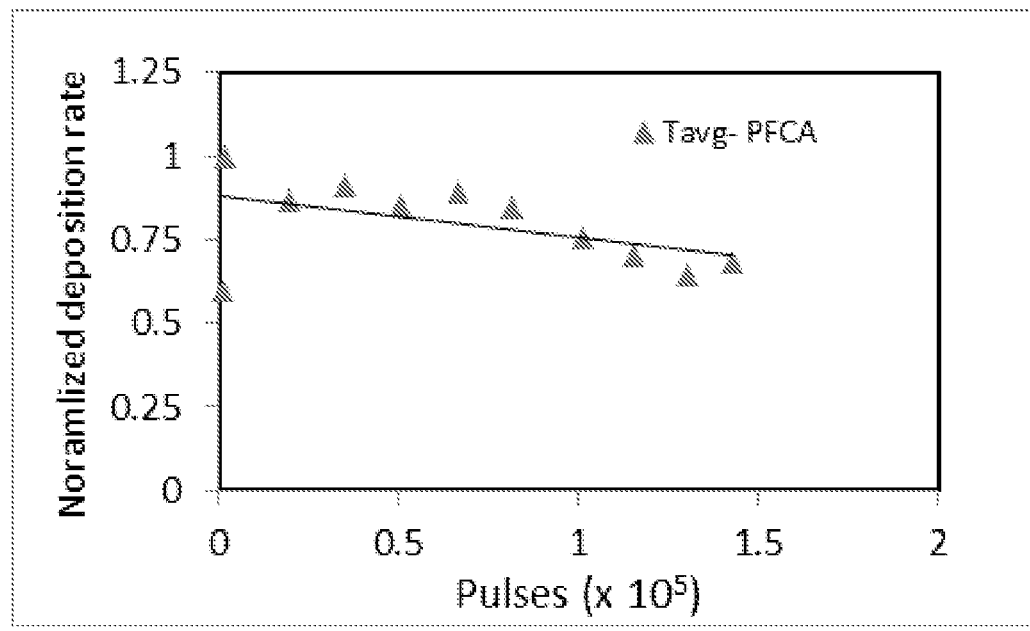

FIG. 10A depicts an reproducibility of an embodiment, compared to the significantly lower reproducibility of conventional systems as shown in FIG. 10B. Deposition rate as a function of pulses is substantially stable with a relatively lower variation from the mean in FIG. 9A, whereas normalized deposition rate decreases as a function of pulses in conventional systems and has a relatively higher variation from the trend line.

Figure 11A:
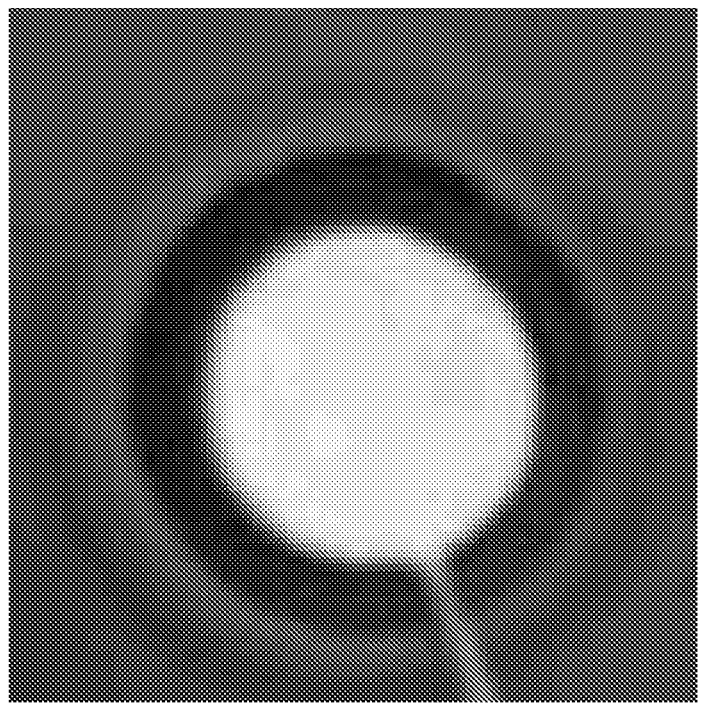
FIGS. 11A and 11B depict the improvement in deterioration characteristics of embodiments described herein.
Figure 11B:
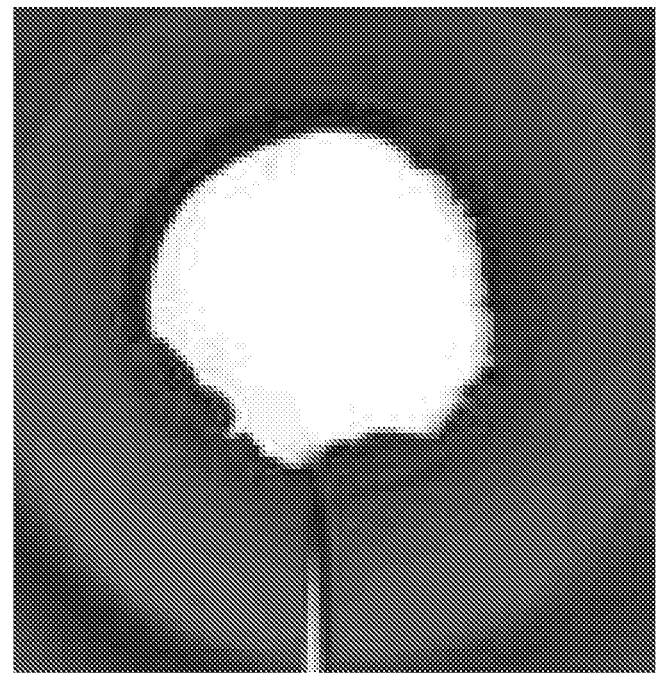

Accumulated carbon amount on the anode baffle ring is shown in the figure for a disclosed embodiment and a prior art source as well, in FIGS. 11A and 11B, respectively. Each of these images corresponds to an anode baffle ring after 150,000 pulses.

The example in FIG. 11A shows that the disclosed source does not degrade over life of the cathode. Rather, deposition rate of the carbon film remains stable while prior art source demonstrated deposition rate drop about 15-20%. Deposition rate reduction during operation as it is seen from anode baffles rings depicted in FIGS. 11A and 11B, respectively, is at least partially a result of much higher parasitic carbon accumulation in the prior art source than in the disclosed source (deposits of 2-3 mm vs. less than 0.4 mm). The accumulated carbon can physically block a portion of the plasma flow causing deposition rate change.

Overall it should be noted that various embodiments of the disclosed source provide generation and expansion of the constricted plasma flow from the cavity. It results in strong self-magnetic field formation and, in turn, the plasma self-pinching effect. A result of the plasma generation in the cavity are directional plasma flow within very narrow cone angle; plasma heating leading to intensive interaction of plasma and droplets that contributes to plasma density raise as well as graphite droplets/particles disappearance; ions acceleration that leads to higher sp3/sp2 ratio in the films. Disclosed embodiments of the source demonstrated particle reduction, deposition rate increase, reduction of graphite consumption per Angstrom of the deposited film; hardness, density, and transparency increase; and reduced parasitic carbon accumulation inside of the source.

From the forgoing description, it is clear that the disclosed embodiments provide an improved method and source for a high sp3/sp2 ratio carbon films. Enhanced aspects of the disclosed embodiments can include film hardness, density, and transparency improvement, high reproducibility, long duration operation, and particulate reduction.

All of the features disclosed in this specification (including any accompanying claims, abstract and drawings), and/or all of the steps of any method or process so disclosed, can be combined in any combination, except combinations where at least some of such features and/or steps are mutually exclusive. Each feature disclosed in this specification can be replaced by alternative features serving the same, equivalent, or similar purpose, unless expressly stated otherwise. Thus, unless expressly stated otherwise, each feature disclosed is one example only of a generic series of equivalent or similar features.

For purposes of interpreting the claims for the present invention, it is expressly intended that the provisions of Section 112, sixth paragraph of 35 U.S.C. are not to be invoked unless the specific terms "means for" or "step for" are recited in the subject claim.

What is claimed is:

1. An apparatus for generation of directional carbon containing plasma flow in a cathodic arc source comprising:
    a cylindrical graphite cathode rod and an anode formed from of a plurality of spaced baffles, the cylindrical graphite cathode rod configured to generate the directional carbon, wherein the cylindrical graphite cathode rod and the anode are separated by an annular shield, and the cylindrical graphite cathode rod is within the annular shield, the annular shield further including an insulator tube with a thin wall graphite bushing inlaid inside of the insulator tube that coaxially surrounds at least a top surface of the cylindrical graphite cathode rod at an initial cathode tip position;
    a bent solenoidal magnetic filter downstream of the cathodic arc source; and
    a graphite cavity formed by extending both the annular shield and the thin wall graphite bushing beyond the top surface of the cylindrical graphite cathode rod at the initial cathode tip position, thereby creating a semi-confined space with a cavity orifice at least partially shaped identical to a shape of the top surface of the cylindrical graphite cathode rod.

2. The apparatus of claim 1, wherein the cathodic arc source further comprising a mechanism configured to selectively move the cylindrical graphite cathode rod inside of the annular shield along a rod axis in the direction of the cavity orifice protruding above the cavity orifice to a reference point and back to the initial cathode tip position.

3. The apparatus of claim 2, wherein the reference point is determined by a laser beam directed in between the baffles of the anode crossing the rod axis and a detector that is configured to control the laser beam indicates a drop of intensity when the cylindrical graphite cathode rod crosses a propagation line of the laser beam.

4. The apparatus of claim 3, further comprising a feedback system configured to pass a signal from the detector to a controller that controls the mechanism to selectively move the cylindrical graphite cathode rod and returns the cylindrical graphite cathode rod to the initial cathode tip position.

5. The apparatus of claim 1, wherein an arc discharge current of the cathodic arc source is higher than 600A.

6. The apparatus of claim 1, wherein the cavity orifice defines a diameter of approximately 5 mm to approximately 12 mm.

7. The apparatus of claim 1, wherein the anode defines a diameter that is approximately equal to a diameter of the cavity orifice.

8. The apparatus of claim 1, wherein a length of the anode does not exceed five times a diameter of the cavity orifice.

9. The apparatus of claim 1, wherein a diameter of the bent solenoidal magnetic filter is approximately two to four times a diameter of the cavity orifice.

10. The apparatus of claim 1, wherein a magnetic field strength inside of the bent solenoidal magnetic filter is approximately 1.5 to approximately 4 times a magnetic field strength sufficient to magnetize electrons.

11. The apparatus of claim 1, wherein a magnetic field strength in a central area of the bent solenoidal magnetic filter ranges between approximately 400 Gauss and approximately 1200 Gauss.

12. The apparatus of claim 1, wherein a current in the bent solenoidal magnetic filter solenoid is between approximately 400 Amps and approximately 800 Amps.

13. The apparatus of claim 1, wherein the cathodic arc source and the bent solenoidal magnetic filter are operated in a pulsed mode, and an arc pulse starts after a filter coil current pulse begins and ends before the filter coil current pulse ends.

* * * * *